(12) United States Patent
Wang (10) Patent No.: US 10,832,920 B2
(45) Date of Patent: Nov. 10, 2020

(54) INSULATOR SEMICONDUCTOR DEVICE-STRUCTURE

(71) Applicants: Semiconductor Manufacturing International (Beijing) Corporation, Beijing (CN); Semiconductor Manufacturing International (Shanghai) Corporation, Shanghai (CN)

(72) Inventor: Xianchao Wang, Shanghai (CN)

(73) Assignees: SEMICONDUCTOR MANUFACTURING INTERNATIONAL (BEIJING) CORPORATION, Beijing (CN); SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 16/269,794

(22) Filed: Feb. 7, 2019

(65) Prior Publication Data

US 2019/0172721 A1 Jun. 6, 2019

Related U.S. Application Data

(62) Division of application No. 15/679,937, filed on Aug. 17, 2017, now Pat. No. 10,249,508.

(30) Foreign Application Priority Data

Sep. 6, 2016 (CN) .......................... 2016 1 0803758

(51) Int. Cl.
*H01L 21/311* (2006.01)
*B81C 1/00* (2006.01)
(Continued)

(52) U.S. Cl.
CPC .... *H01L 21/31116* (2013.01); *B81C 1/00587* (2013.01); *H01L 21/3213* (2013.01);
(Continued)

(58) Field of Classification Search
CPC .......................... H01L 21/31116; H01L 23/13
See application file for complete search history.

(56) References Cited

U.S. PATENT DOCUMENTS 7,008,812 B1 3/2006 Carley
10,177,027 B2 1/2019 Wang
(Continued)

FOREIGN PATENT DOCUMENTS

CN 101459866 6/2009
CN 103308239 A 9/2013
(Continued)

OTHER PUBLICATIONS

U.S. Appl. No. 15/679,914, Non-Final Office Action, dated Feb. 9, 2018, 9 pages.
(Continued)

*Primary Examiner* — Eugene Lee
(74) *Attorney, Agent, or Firm* — Kilpatrick Townsend & Stockton LLP (57) ABSTRACT

A semiconductor device includes a semiconductor substrate, a first semiconductor layer on the semiconductor substrate and having an exposed portion of a lower surface, a capping layer on the first semiconductor layer, a second semiconductor layer below the capping layer and having a side surface substantially in full contact with the capping layer, a cavity defined by the first semiconductor layer, the second semiconductor layer, and the capping layer, and a through-hole passing through the capping layer and the second semiconductor layer and extending to the cavity.

13 Claims, 6 Drawing Sheets

(51) Int. Cl.
*H01L 21/3213* (2006.01)
*H01L 29/16* (2006.01)
*H01L 21/02* (2006.01)

(52) U.S. Cl.
CPC ...... *H01L 29/16* (2013.01); *B81B 2201/0257* (2013.01); *B81B 2203/0127* (2013.01); *H01L 21/02532* (2013.01)

(56) References Cited

U.S. PATENT DOCUMENTS

| | | | |
|---|---|---|---|
| 10,249,508 B2 | 4/2019 | Wang | |
| 2002/0067663 A1 | 6/2002 | Loeppert et al. | |
| 2006/0233401 A1 | 10/2006 | Wang | |
| 2006/0291674 A1 | 12/2006 | Gong et al. | |
| 2007/0001247 A1 | 1/2007 | Patel et al. | |
| 2008/0094686 A1 | 4/2008 | U'ren | |
| 2009/0116675 A1 | 5/2009 | Miyoshi | |
| 2010/0065930 A1 | 3/2010 | Nakatani | |
| 2010/0075481 A1* | 3/2010 | Yang | B81C 1/00246 438/458 |
| 2011/0122731 A1 | 5/2011 | Buccafusca et al. | |
| 2012/0139065 A1 | 6/2012 | Van et al. | |
| 2012/0280594 A1 | 11/2012 | Chen et al. | |
| 2013/0233086 A1 | 9/2013 | Besling et al. | |
| 2013/0270658 A1 | 10/2013 | Behrendt et al. | |
| 2013/0278609 A1 | 10/2013 | Stephanou et al. | |
| 2014/0053651 A1 | 2/2014 | Besling et al. | |
| 2014/0286509 A1* | 9/2014 | Sciutti | H04R 19/04 381/174 |
| 2014/0375168 A1 | 12/2014 | Dirksen et al. | |
| 2015/0001647 A1 | 1/2015 | Dehe et al. | |
| 2015/0162852 A1 | 6/2015 | Dirksen et al. | |
| 2015/0251895 A1* | 9/2015 | Chu | B81C 1/00238 257/595 |
| 2015/0256144 A1 | 9/2015 | Andosca et al. | |
| 2016/0112807 A1* | 4/2016 | Yuan | H04R 19/04 381/174 |
| 2018/0068864 A1 | 3/2018 | Wang | |
| 2018/0068888 A1 | 3/2018 | Wang | |
| 2018/0208454 A1* | 7/2018 | Hoekstra | B81B 3/0029 |

FOREIGN PATENT DOCUMENTS

| | | |
|---|---|---|
| CN | 103373700 A | 10/2013 |
| CN | 104254046 A | 12/2014 |
| CN | 107364827 | 11/2017 |
| JP | 2014180702 | 9/2014 |

OTHER PUBLICATIONS

U.S. Appl. No. 15/679,914, Notice of Allowance, dated Sep. 12, 2018, 8 pages.
U.S. Appl. No. 15/679,937, Non Final Office Action, dated May 14, 2018, 10 pages.
U.S. Appl. No. 15/679,937, Notice of Allowance, dated Nov. 8, 2018, 5 pages.
U.S. Appl. No. 15/679,937, Restriction Requirement, dated Jan. 22, 2018, 6 pages.
European Patent Application No. 17186434.1, Extended European Search Report, dated Dec. 22, 2017, 8 pages.
European Patent Application No. 17189301.9, Extended European Search Report, dated Jan. 31, 2018, 9 pages.
Chinese Application No. 201610803758.8, Office Action dated Nov. 27, 2019, 6 pages.
China Patent Application No. 201610805514.3, Office Action, dated Jun. 4, 2019, 10 pages.
Chinese Application No. 201610803758.8, Office Action dated Jun. 5, 2019, 7 pages.

* cited by examiner

INSULATOR SEMICONDUCTOR DEVICE-STRUCTURE

CROSS-REFERENCES TO RELATED APPLICATIONS

This application is a divisional application of U.S. patent application Ser. No. 15/679,937, filed on Aug. 17, 2017, which claims priority to Chinese Patent Application No. 201610803758.8, filed on Sep. 6, 2016, the contents of which are incorporated herein by reference in their entirety.

This application is related to U.S. patent application Ser. No. 15/679,914, filed Aug. 17, 2017, issued on Jan. 8, 2019 as U.S. Pat. No. 10,177,027, entitled "METHOD FOR REDUCING CRACKS IN A STEP-SHAPED CAVITY", the content of which is incorporated herein by reference in its entirety.

BACKGROUND OF THE INVENTION

The present invention relates to semiconductor technology. More particularly, this invention relates to an improved semiconductor device that is free of capillary induced etching effects and a manufacturing method thereof.

Figure 1A:
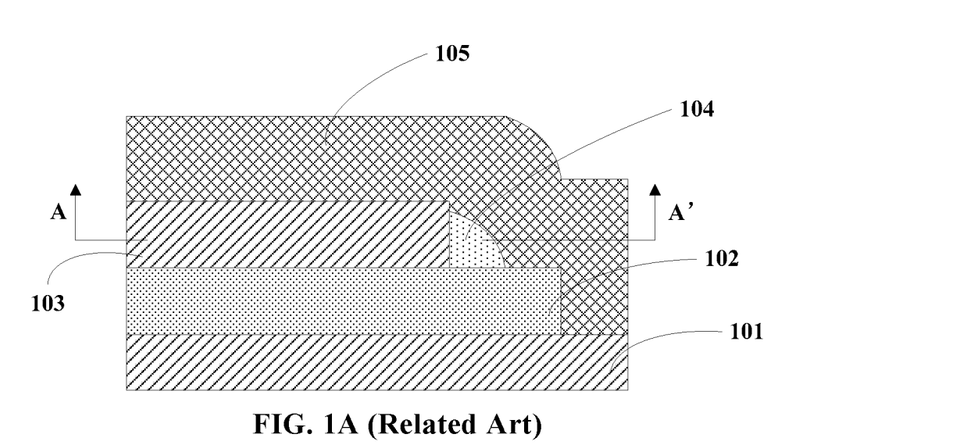
FIG. 1A is a cross-sectional view illustrating a stage of a method of manufacturing a structure of the related art that may be applied to facilitate the description of embodiments of the present invention.

In the micro electromechanical system (MEMS) field, a variety of materials and thin films with different thicknesses may be formed on the wafer to implement certain functions of a MEMS device. In the patterning process, when an etching process is performed on the different thicknesses of the thin films, in order to obtain a certain shape, the silicon oxide portion at the interface is left unetched to form a spacer. FIG. 1A is a cross-sectional view of a portion of a structure in the related art. As shown in FIG. 1A, the structure includes a first polysilicon layer 101, a first silicon dioxide layer 102 on first polysilicon layer 101, a second polysilicon layer 103 on first silicon dioxide layer 102, a spacer (e.g., silicon dioxide) 104 on the side of second polysilicon layer 103, and a silicon nitride layer 105 covering theses layers.

Figure 1B:
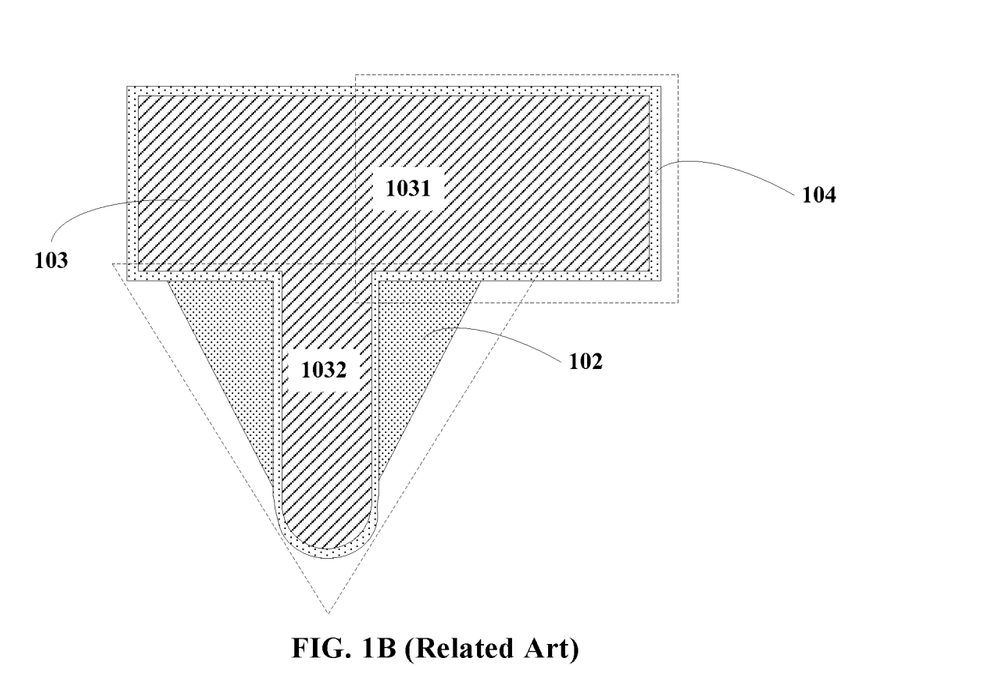
FIG. 1B is a cross-sectional view illustrating a portion of the structure shown in FIG. 1A taken along thee line A-A'.

FIG. 1B is a cross-sectional view of the structure of FIG. 1A taken along the line A-A'. For the clarity of the description, FIG. 1B does not show silicon nitride layer 105. Second polysilicon layer 103 includes a main chip region 1031 and a rod-like region 1032. The cross-sectional view of the structure shown in FIG. 1A is a schematic cross-sectional view of the portion of main chip region 1031 (shown in the dotted line box portion in FIG. 1B, where silicon nitride layer 105 is not shown).

Figure 1C:
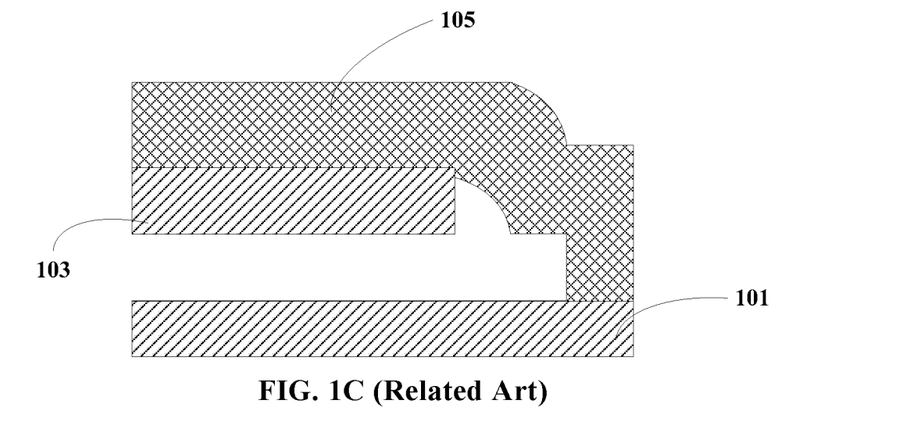
FIG. 1C is a cross-sectional view illustrating a portion of the structure shown in FIG. 1A after performing a buffered oxide etch (BOE).

In the process of forming a cavity, first silicon dioxide layer 102 (the first silicon dioxide layer serves as a buffer oxide) of main chip region 103 is etched using a buffered oxide etch (BOE) process, but spacer 104 (shown in FIG. 1B) at the interface of main chip region 1031 is significantly etched because the spacer is very fine (which may be referred to as capillary silicon dioxide). In the BOE process, due to the capillary effect, the portion of the silicon oxide in the vicinity of the spacer is etched quickly, far beyond the normal etch rate, resulting in an excessive etching of the silicon oxide that should not have been etched. Thus, it is impossible to control the to-be-etched area, as shown in FIG. 1C. The capillary silicon dioxide (i.e., the spacer) is etched too fast, causing the region in the vicinity of the spacer to have a void, so that when the structure is in a vibration or under pressure, cracks will develop in the structure and cause the device failure. The dotted line triangle in FIG. 1B is a region which is not intended to be affected by the BOE process.

In view of the above described problems, conventional methods may utilize the following approaches. One approach is to increase the density of the silicon dioxide by subjecting the initial capillary silicon dioxide (i.e., spacer 104) to an annealing treatment. Although the BOE process reduces the etch rate for the silicon dioxide, and the BOE affected area can be reduced, however, this approach is not sufficient to improve the device reliability.

The other approach is to replace the initial capillary silicon dioxide with silicon nitride. However, the capillary silicon nitride cannot be etched cleanly, and as a result, fall off (peeling) of the silicon nitride on the device causes device defects.

BRIEF SUMMARY OF THE INVENTION

The present inventor provides a novel semiconductor device and method of manufacturing the same to solve the above-described problems.

In accordance with the present invention, a semiconductor device includes a structure that can prevent the capillary etching effect on the spacer from occurring. A method for manufacturing the semiconductor device is also provided.

In accordance with the present invention, the method may include forming a first semiconductor layer on a semiconductor substrate; forming a first insulator layer on the first semiconductor layer; forming a patterned second semiconductor layer on the first insulator layer, the patterned second semiconductor layer having an actual thickness greater than a target thickness and exposing a portion of the first insulator layer; forming a second insulator layer as a spacer on the exposed portion of the first insulator layer; performing an etching process on the patterned second semiconductor layer until the second semiconductor layer has the target thickness, and concurrently removing the second insulator layer.

In one embodiment, the actual thickness is 30% to 50% greater than the target thickness. In one embodiment, the actual thickness is in a range between 0.45 um and 0.6 um, and the target thickness is in a range between 0.3 um and 0.4 um.

In one embodiment, the first and second semiconductor layers each include polysilicon; and the first and second insulator layers each include silicon oxide.

In one embodiment, forming the patterned second semiconductor layer on the first insulator layer includes forming a second semiconductor layer on the first insulator layer; and patterning the second semiconductor layer to expose the portion of the first insulator layer.

In one embodiment, the exposed portion of the first insulator layer is an edge portion.

In one embodiment, patterning the second semiconductor layer includes forming a first through-hole through the first insulator layer.

In one embodiment, the method may further include forming a capping layer on the first semiconductor layer, the first insulator layer, and the second semiconductor layer. The capping layer has a material that is different from the material of the first insulator layer. In one embodiment, the capping layer comprises silicon nitride.

In one embodiment, the method may further include forming a first recess exposing a surface portion of the first semiconductor layer, a second recess exposing a surface portion of the second semiconductor layer, and a second through-hole aligned with the first through-hole. The first and second through-holes collectively form a through-hole that passes through the capping layer and the second semiconductor layer and extends to the first insulator layer.

In one embodiment, the method may further include forming a first contact layer on a bottom of the first recess; and forming a second contact layer on a bottom and sidewalls of the second recess and extending on an upper layer of the capping layer.

In one embodiment, the first and second contact layers each may include aluminum, copper, or tungsten.

In one embodiment, the method may further include performing an etching process on the semiconductor substrate to form a third recess exposing a portion of a lower surface of the first semiconductor layer.

In one embodiment, the method may further include removing the first insulator layer to form a cavity that is defined by the first semiconductor layer, the second semiconductor layer, and the capping layer.

In one embodiment, performing the etching process on the patterned second semiconductor layer includes rounding off an edge of the second semiconductor layer and an edge portion of the first insulator layer.

In one embodiment, performing the etching process on the patterned second semiconductor layer includes rounding off an edge of the first semiconductor layer.

Embodiments of the present invention also provide a semiconductor device that includes a semiconductor substrate, a first semiconductor layer on the semiconductor substrate and having an exposed portion of a lower surface, a capping layer on the first semiconductor layer; a second semiconductor layer below the capping layer and having a side surface substantially in full contact with the capping layer, a cavity defined by the first semiconductor layer, the second semiconductor layer, and the capping layer, and a through-hole passing through the capping layer and the second semiconductor layer and extending to the cavity.

In one embodiment, the through-hole includes a first through-hole passing the second semiconductor layer, and a second through-hole passing the capping layer and aligned with the first through-hole.

In one embodiment, the first and second semiconductor layers each include polysilicon; and the capping layer include silicon nitride.

In one embodiment, the semiconductor device further includes a first recess in the capping layer exposing a surface portion of the first semiconductor layer, and a second recess in the capping layer exposing a surface portion of the second semiconductor layer.

In one embodiment, the semiconductor further includes a first contact layer on a bottom of the first recess, and a second contact layer on a bottom and sidewalls of the second recess and extending over an upper surface of the capping layer. In one embodiment, the first and second contact layers each include aluminum, copper, or tungsten.

In one embodiment, the semiconductor device further includes a third recess exposing a lower surface portion of the first semiconductor layer.

The following description, together with the accompanying drawings, will provide a better understanding of the nature and advantages of the claimed invention.

BRIEF DESCRIPTION OF THE DRAWINGS

The accompanying drawings, which are included to provide a further understanding of the invention and are incorporated in and constitute a part of this application, illustrate certain embodiments of the invention. In the drawings.

DETAILED DESCRIPTION OF THE INVENTION

In the following description, numerous specific details are provided for a thorough understanding of the present invention. However, it should be appreciated by those of skill in the art that the present invention may be realized without one or more of these details. In other examples, features and techniques known in the art will not be described for purposes of brevity.

It should be understood that the drawings are not drawn to scale, and similar reference numbers are used for representing similar elements. Embodiments of the invention are described herein with reference to cross-section illustrations that are schematic illustrations of idealized embodiments and intermediate structures) of the invention. The thickness of layers and regions in the drawings may be exaggerated relative to each other for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

It will be understood that, when an element or layer is referred to as "on," "disposed on," "adjacent to," "connected to," or "coupled to" another element or layer, it can be disposed directly on the other element or layer, adjacent to, connected or coupled to the other element or layer, or intervening elements or layers may also be present. In contrast, when an element is referred to as being "directly on," directly disposed on," "directly connected to," or "directly coupled to" another element or layer, there are no intervening elements or layers present between them. It will be understood that, although the terms "first," "second," "third," etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Relative terms such as "under," "below," "underneath," "over," "on," "above," "bottom," and "top" are used herein to described a relationship of one element, layer or region to another element, layer or region as illustrated in the figures. It will be understood that these terms are intended to encompass different orientations of the structure in addition to the orientation depicted in the figures. For example, if the device shown in the figures is flipped, the description of an element being "below" or "underneath" another element would then be oriented as "above" the other element. Therefore, the term "below," "under," or "underneath" can encompass both orientations of the device. Because devices or components of embodiments of the present invention can be positioned in a number of different orientations (e.g., rotated 90 degrees or at other orientations), the relative terms should be interpreted accordingly.

The terms "a", "an" and "the" may include singular and plural references. It will be further understood that the terms "comprising", "including", "having" and variants thereof, when used in this specification, specify the presence of stated features, steps, operations, elements, and/or components, but do not preclude the presence or addition of one or more other features, steps, operations, elements, components, and/or groups thereof. Furthermore, as used herein, the words "and/or" may refer to and encompass any possible combinations of one or more of the associated listed items.

The use of the terms first, second, etc. do not denote any order, but rather the terms first, second, etc. are used to distinguish one element from another. Furthermore, the use of the terms a, an, etc. does not denote a limitation of quantity, but rather denote the presence of at least one of the referenced items.

Embodiments of the invention are described herein with reference to cross-section illustrations that are schematic illustrations of idealized embodiments (and intermediate structures) of the invention.

Figure 2:
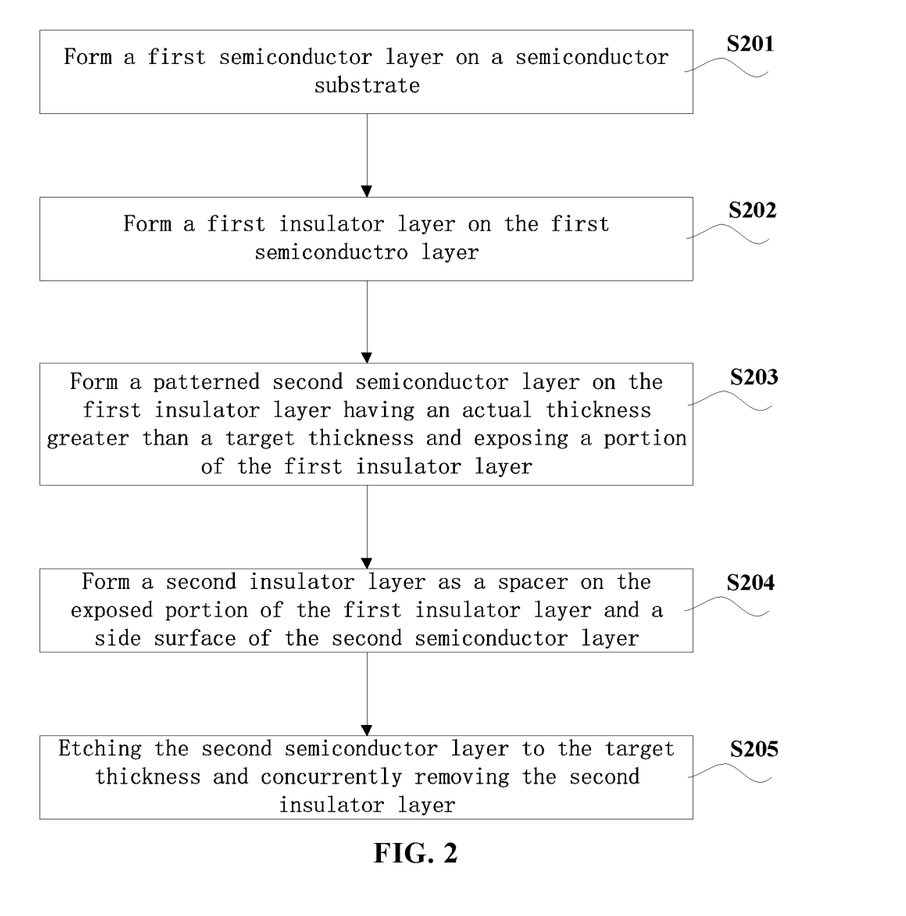
FIG. 2 is a simplified flow chart of a method for manufacturing a semiconductor device according to an embodiment of the present invention.

FIG. 2 is a simplified flow chart of a method for manufacturing a semiconductor device according to an embodiment of the present invention. FIGS. 3A to 3J are cross-sectional views illustrating stages of a method of manufacturing a semiconductor device according to some embodiments of the present invention. A manufacturing method of a semiconductor device according to some embodiments of the present invention will now be described in detail with reference to FIG. 2 and FIGS. 3A to 3J.

Referring to FIG. 2, the method may include the following steps:

Step S201: providing a semiconductor substrate, and forming a first semiconductor layer on the semiconductor substrate.

Figure 3A:
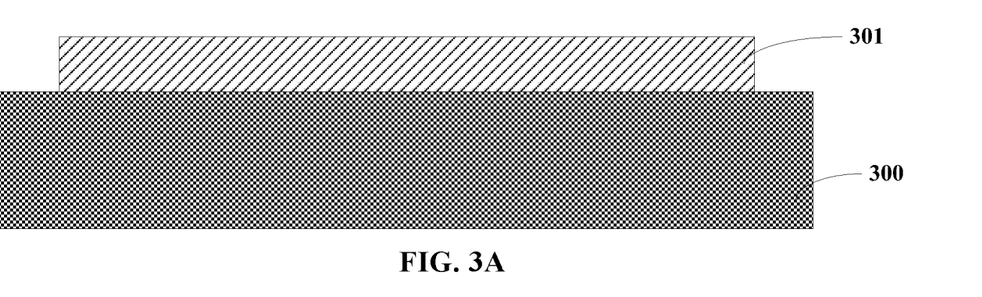
FIGS. 3A to 3J are cross-sectional views illustrating stages of a method of manufacturing a semiconductor device according to some embodiments of the present invention.

FIG. 3A is a cross-sectional view illustrating a structure in the manufacturing process S201 according to an embodiment of the present invention. As shown in FIG. 3A, a first semiconductor layer 301 is formed on semiconductor substrate 300. Semiconductor substrate 300 may be a silicon substrate. First semiconductor layer 301 may include polysilicon.

In one embodiment, step S201 may include forming first semiconductor layer 301 on semiconductor substrate 300 using a deposition process. In one embodiment, step S201 may also include patterning first semiconductor layer 301 to expose an edge portion of semiconductor substrate 300, as shown in FIG. 3A.

As used herein, the term "edge portion" refers to a portion of a structure (e.g., a layer, a film, a substrate, or the like) extending a certain distance from a side edge to a middle of the structure. The certain distance may be determined based on actual requirements.

Referring back to FIG. 2, the method may also include forming a first insulator layer on the first semiconductor layer in step S202.

Figure 3B:
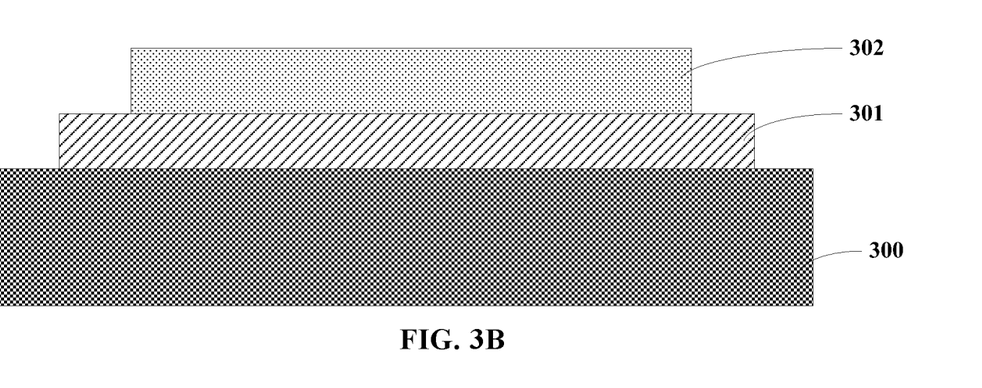

FIG. 3B is a cross-sectional view illustrating a structure in the manufacturing process S202 according to an embodiment of the present invention. As shown in FIG. 3B, a first insulator layer 302 is formed on first semiconductor layer 301. First insulator layer 302 may include silicon dioxide.

In one embodiment, step S202 may include forming first insulator layer 302 on first semiconductor layer 301 using a deposition process or an oxidation process. In one embodiment, step S202 may also include patterning first insulator layer 302 to expose an edge portion of first semiconductor layer 301, as shown in FIG. 3B.

Referring back to FIG. 2, the method may also include forming a patterned second semiconductor layer on the first insulator layer in step S203. The second semiconductor layer has an actual thickness that is greater than the target thickness and exposes a portion of the first insulator layer.

Figure 3C:
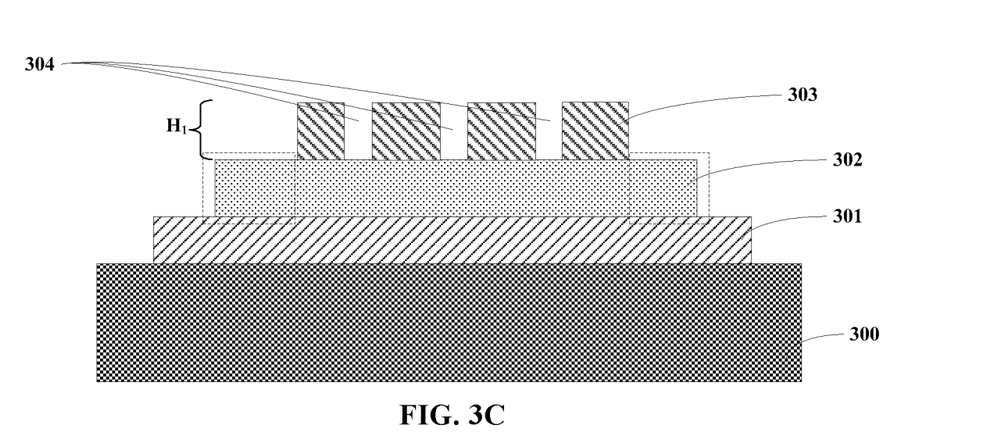

FIG. 3C is a cross-sectional view illustrating a structure in the manufacturing process S203 according to an embodiment of the present invention. As shown in FIG. 3C, a second semiconductor layer 303 is formed on first insulator layer 302. Second semiconductor layer 303 has an actual thickness $H_1$ that is greater than the target thickness $H_0$ and exposes a portion of first insulator layer 302. The second semiconductor layer may include polysilicon.

In one embodiment, in step S203, the actual thickness of second semiconductor layer 303 may be 30% to 50% greater than the target thickness. In one embodiment, the actual thickness of second semiconductor layer 303 may be in the range between about 0.45 um and about 0.6 um, e.g., 0.5 um. In one embodiment, the target thickness of second semiconductor layer 303 may be in the range between about 0.3 um and about 0.4 um, e.g., 0.35 um.

In one embodiment, step S203 may include forming second semiconductor layer 303 on first insulator layer 302 using a deposition process. In one embodiment, step S203 may also include patterning second semiconductor layer 303 to expose a portion of first insulator layer 302, as shown in FIG. 3C.

In one embodiment, in the patterning process of second semiconductor layer 303, the exposed portion of first insulator layer 302 is an edge portion, as indicated by the dashed box in FIG. 3C. Referring to FIG. 3C, first semiconductor layer 301, first insulator layer 302, and second semiconductor layer 303 form a multilayer film having a step-shaped portion including multiple steps formed by the edge portion of each layer.

In one embodiment, in the patterning process of second semiconductor layer 303, a first through-hole 304 is also formed through second semiconductor layer 303 and extending to first insulator layer 302.

Referring back to FIG. 2, the method may also include forming a second insulator layer as a spacer on the exposed portion of the first insulator layer and on a side surface of the second semiconductor layer in step S204.

Figure 3D:
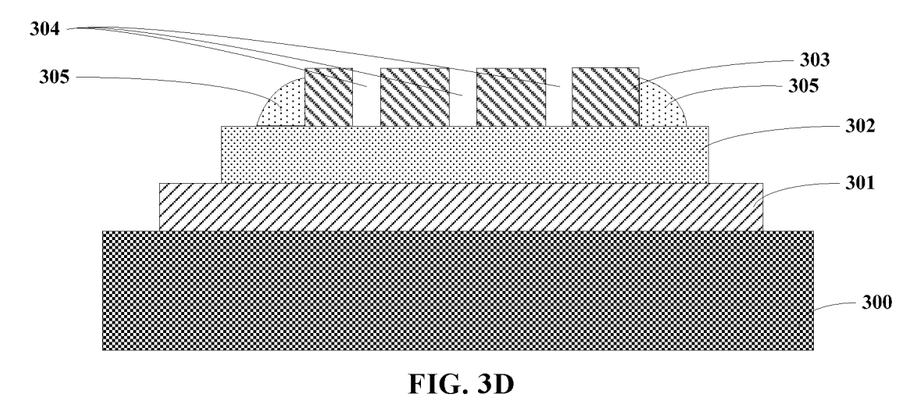

FIG. 3D is a cross-sectional view illustrating a structure in the manufacturing process S204 according to an embodiment of the present invention. As shown in FIG. 3D, a second insulator layer 305 is formed as a spacer on the exposed portion (i.e., the exposed edge portion) of first insulator layer 302 and on a side surface of second semiconductor layer 303. Second insulator layer 305 may include silicon dioxide.

In one embodiment, step S204 may include forming second insulator layer 305 on the structure of FIG. 3C using a deposition process, and then performing an etching process on second insulator layer 305 to form the spacer.

Referring back to FIG. 2, the method may also include performing an etching process on the second semiconductor layer to thin the second semiconductor layer from the actual thickness to the target thickness and removing the second insulator layer in step S205.

Figure 3E:
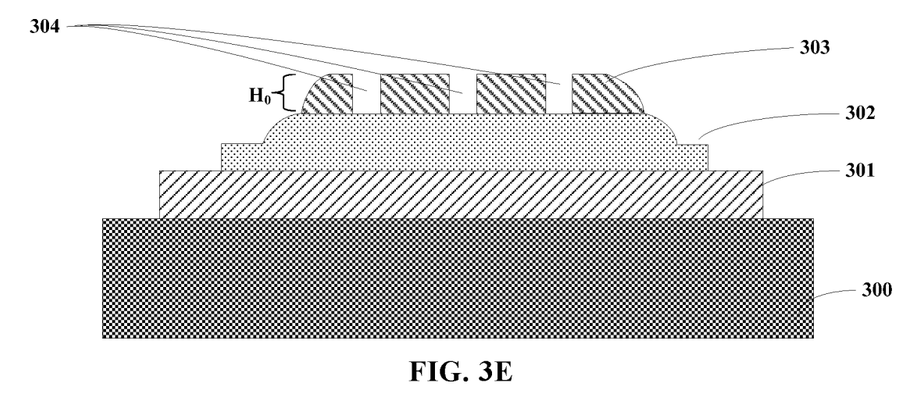

FIG. 3E is a cross-sectional view illustrating a structure in the manufacturing process S205 according to an embodiment of the present invention. As shown in FIG. 3E, an etching process is performed on second semiconductor layer 303 to thin second semiconductor layer 303 to the target thickness $H_0$ and remove second insulator layer 305.

In a preferred embodiment, second insulator layer 305 is also removed while performing the etching process on second semiconductor layer 303. In an exemplary embodiment, the etching process may be performed using an etching gas, e.g., octafluorocyclobutane $C_4F_8$.

In another embodiment, second semiconductor layer 303 may be first thinned using an etching process, and thereafter, second insulator layer 305 is removed.

In some embodiments, in step S205, the etching process may also round off the edge of second semiconductor layer 303 and also at least a portion of the edge of first insulator 302, as shown in FIG. 3E. In some other embodiments, in performing the etching process on second semiconductor layer 303, the etching process also rounds off the edge of first semiconductor layer 301 (not shown). The edge rounding process is advantageous in increasing the density of portions of a capping layer that is subsequently formed on the edges of the multilayer film, thereby improving the device reliability.

Thus, embodiments of the present invention provide a method for manufacturing a semiconductor device. In accordance with the present invention, by removing the second insulator layer that serves as a spacer, it is possible to prevent capillary etching and siphoning effects from occurring on the spacer in a subsequent BOE process and achieve the control of the effect of etching the region, which can improve the device performance and the device resistance to vibration and pressure.

Figure 3F:
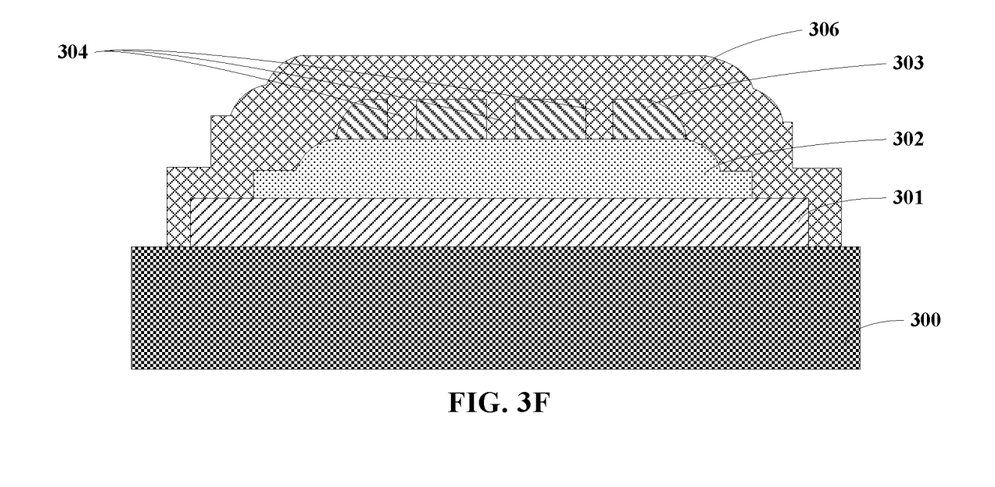

In one embodiment, the method may further include forming a capping layer 306 (e.g., using a deposition process) on first semiconductor layer 301, first insulator layer 302, and second semiconductor layer 303, as shown in FIG. 3F. Capping layer 306 includes a material different from the material of first insulator layer 302. For example, the capping layer may include silicon nitride.

In the embodiment, since the etching process in step S205 rounds off the edge of second semiconductor layer 303 and at least one portion of first insulator layer 302, so that the portion of the capping layer on these rounded off edges (i.e., the graded curved surface of the edges of the steps) has a relatively high density, therefore, a subsequent removal of first insulator layer 302 will not cause cracks in the capping layer that would have occurred if the step-shaped edges of the capping layer have a low density. The crack-free capping layer will improve the device reliability.

Figure 3G:
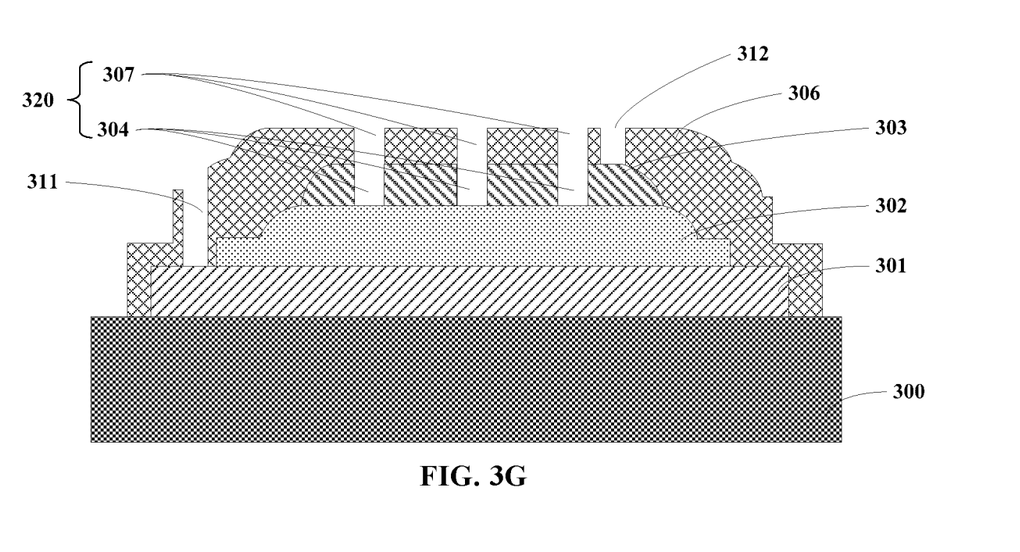

Next, in one embodiment, the method may also include performing an etching process on capping layer 306 to form a first recess 311 exposing a portion of the surface of first semiconductor layer 301, a second recess 312 exposing a portion of the surface of second semiconductor layer 303, and a second through-hole 307 that is aligned with first through-hole 304, as shown in FIG. 3G. First through-hole 304 and second through-hole 307 collectively form a through-hole 320 passing through capping layer 306 and second semiconductor layer 303 and extending to first insulator layer 302.

Figure 3H:
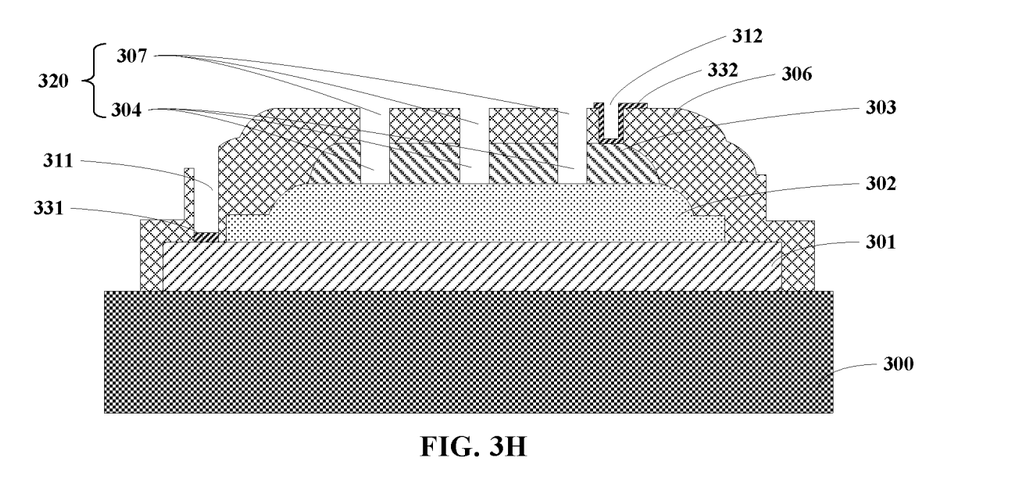

Next, in one embodiment, the method may also include forming a first contact layer 331 on the bottom of first recess 311, and a second contact layer on the bottom and sidewalls of second recess 312 and extending over the upper surface of capping layer 306, as shown in FIG. 3H. In one exemplary embodiment, first contact layer 331 and second contact layer 332 may include, respectively, a metal, e.g., aluminum, copper, or tungsten. In one embodiment, the first contact layer may be formed on the bottom and sidewalls of the first recess and may extends to the upper surface of the capping layer. However, the first and second contact layers are separated from each other.

Figure 3I:
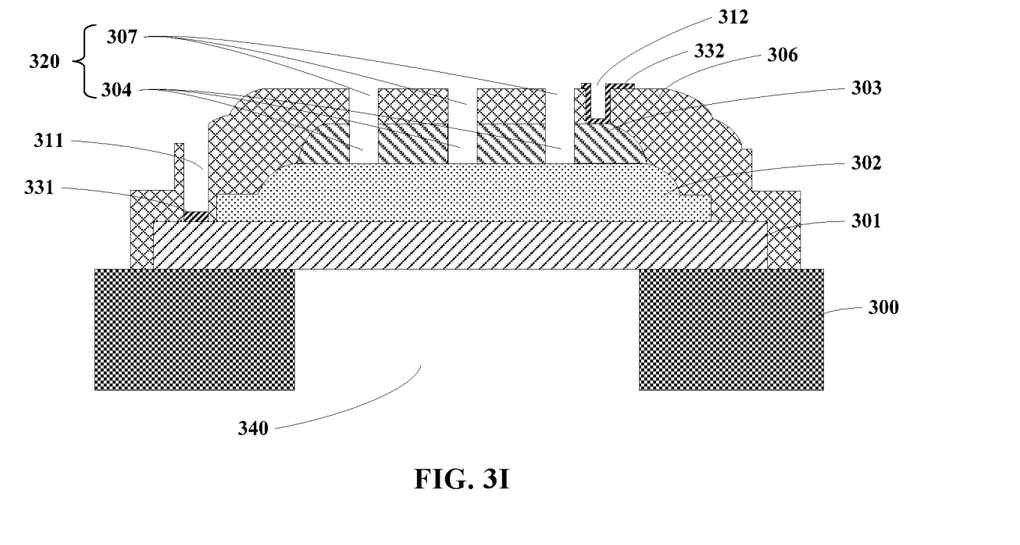

Next, in one embodiment, the method may also include performing an etching process on semiconductor substrate 300 to form a third recess 340 that exposes a portion of the surface of first semiconductor layer 301, as shown in FIG. 3I.

Figure 3J:
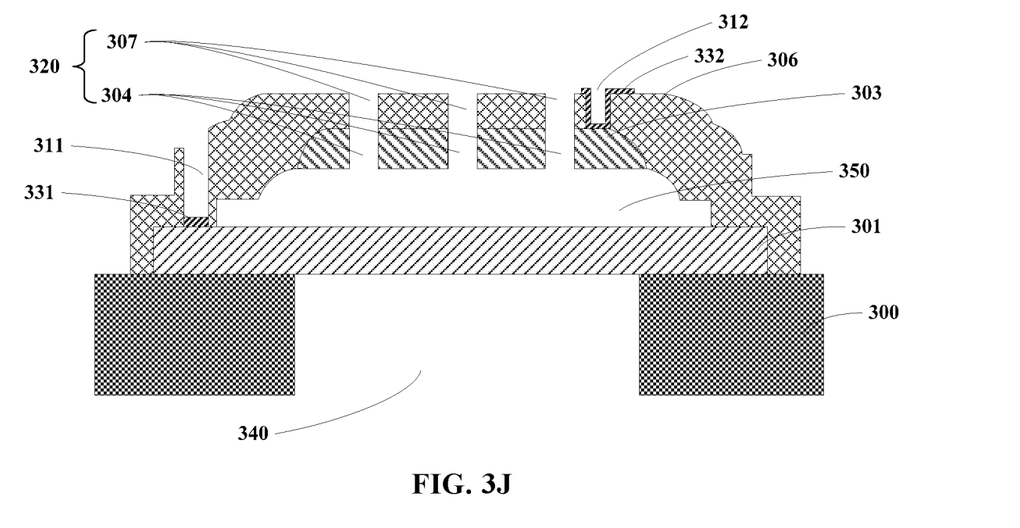

Next, in one embodiment, the method may also include removing first insulator layer 302 to form a cavity 350 that is defined by first semiconductor layer 301, second semiconductor layer 303 and capping layer 306, as shown in FIG. 3J.

In one embodiment, first insulator layer 302 may be removed using a BOE process. For example, first insulator layer 302 may be removed by injecting hydrofluoric acid as an etchant through through-hole 320 to form cavity 350.

Thus, embodiments of the present invention provide a method for manufacturing a semiconductor device In accordance with the present invention, the second insulator layer that serves as a spacer is removed prior to forming the capping layer, such that a capillary effect will not be present in a subsequent removal of the first insulator layer, so that the device reliability is improved. And by forming the second semiconductor layer with an actual thickness that is greater than the target thickness, when the second insulator layer is removed by thinning the second semiconductor layer, the thinned second semiconductor layer has the target thickness, so that the device performance is not affected.

Further, in the thinning process (e.g., using an etching process) of the second semiconductor layer, the etching process also rounds off the edge of the second semiconductor layer and at least one portion of the edge of the first insulator layer. Further, the etching process also rounds off the edge of the first semiconductor layer. The edge rounding process is advantageous in increasing the density of the portion of the capping layer formed on the edges of these rounded off edges of the step-shaped film in a subsequent process, thereby improving the device reliability.

In MEMS applications, the manufacturing method according to the present invention can be applied in designs that involve capillary etching in a wet etching process, thereby eliminating the formation of capillaries.

Embodiments of the present invention also provide a semiconductor device. Referring to FIG. 3J, the semiconductor device may include a semiconductor substrate 300 (e.g., silicon substrate).

In one embodiment, the semiconductor device may also include a first semiconductor layer 301 on semiconductor substrate 300 that exposes a portion of the lower surface of first semiconductor layer 301. For example, a third recess 340 is formed in semiconductor substrate 300 and exposes a lower surface portion of first semiconductor layer 301, as shown in FIG. 3J. In one embodiment, first semiconductor layer 301 may include polysilicon.

In one embodiment, the semiconductor device may also include a capping layer 306 on first semiconductor layer 301. Capping layer 306 may include silicon nitride. In one embodiment, the capping layer may have a portion formed on semiconductor substrate 300, as shown in FIG. 3J.

In one embodiment, the semiconductor device may also include a second semiconductor layer 303 disposed below capping layer 306, as shown in FIG. 3J. Second semiconductor layer 303 has a side surface that is substantially in full contact with the inner surface of capping layer 306. First semiconductor layer 301, second semiconductor layer 303, and capping layer 306 define a cavity 350. Second semiconductor layer 303 may include polysilicon.

As used herein, the term "substantially in full contact" is defined as the ratio of the surface area of the side surface of the second semiconductor layer being in contact with the capping layer to the total surface area of the side surface of the second semiconductor layer is greater than a predetermined value. In one embodiment, the ratio may be greater than 90% (the predetermined value), e.g., 83%, 97%, or 100% (i.e., the total surface area of the side surface of the second semiconductor layer is perfectly in direct contact with the capping layer). Of course, one of skill in the art will appreciate that the ratio may be greater than other predetermined values (e.g., 85%), the term substantially in full contact is intended to also denote this possibility.

In one embodiment, the semiconductor device may also include a through-hole 320 passing through capping layer 306 and second semiconductor layer 303 and extending to cavity 350, as shown in FIG. 3J. In one embodiment, through-hole 320 may include a first through-hole 304 passing through second semiconductor layer 303 and a second through-hole 307 passing through capping layer 306. First through-hole 304 is aligned with second through-hole 307.

In one embodiment, the semiconductor device may also include a first recess 311 exposing a surface portion of first semiconductor layer 301 and a second recess 312 exposing a surface portion of second semiconductor layer 303, as shown in FIG. 3J.

In one embodiment, the semiconductor device may also include a first contact layer 331 on the bottom of first recess 311, and a second contact layer 332 on the bottom and sidewalls of second recess 312. In one embodiment, second contact layer 332 may extend over the upper surface of capping layer 306, as shown in FIG. 3J. First contact layer and second contact layer 332 each may include a metal such as aluminum, copper, or tungsten.

In some embodiments, the semiconductor device shown in FIG. 3J may be used as a microphone in a MEMS device, in which first semiconductor layer 301 operates as a membrane for the microphone, through-hole 320 operates as a sound hole for the microphone, cavity 350 operates as a resonator, first semiconductor layer 301 and second semiconductor layer 303 collectively form a capacitance, and first contact layer 331 and second contact layer 332 operate as metal interconnects for the two electrode plates of the capacitor. When the membrane receives an external sound pressure (sound wave), the membrane changes the capacitance value of the capacitor, so that the sound energy is converted to electric energy. According to the manufacturing method of the present invention, the device reliability, in particular, the microphone reliability is improved.

References in the specification to "one embodiment", "an embodiment", "an example embodiment", "some embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. The terms "forming" and "depositing" may be used interchangeably.

While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments as well as other embodiments will be apparent to those of skill in the art upon reference to the description. It is therefore intended that the appended claims encompass any such modifications.

Furthermore, some of the features of the preferred embodiments of the present invention could be used to advantage without the corresponding use of other features. As such, the foregoing description should be considered as merely illustrative of the principles of the invention, and not in limitation thereof.

What is claimed is:

1. A semiconductor device, comprising:
    a semiconductor substrate;
    a first semiconductor layer on the semiconductor substrate and having an exposed portion of a lower surface;
    a capping layer on the first semiconductor layer and the capping layer being in contact with the first semiconductor layer;
    a second semiconductor layer below the capping layer and having a rounded off surface substantially in full contact with the capping layer;
    a cavity defined by the first semiconductor layer, the second semiconductor layer, and the capping layer; and
    a through-hole passing through the capping layer and the second semiconductor layer and extending to the cavity.

2. The semiconductor device of claim 1, wherein the through-hole comprises:
    a first through-hole passing the second semiconductor layer; and
    a second through-hole passing the capping layer and aligned with the first through-hole.

3. The semiconductor device of claim 1, wherein the first and second semiconductor layers each comprise polysilicon; and the capping layer comprise silicon nitride.

4. The semiconductor device of claim 1, further comprising:
    a first recess in the capping layer extending to the first semiconductor layer; and
    a second recess in the capping layer extending to the second semiconductor layer.

5. The semiconductor device of claim 4, further comprising:
    a first contact layer on a bottom of the first recess; and
    a second contact layer on a bottom and sidewalls of the second recess and extending over an upper surface of the capping layer.

6. The semiconductor device of claim 5, wherein the first and second contact layers each comprise aluminum, copper, or tungsten.

7. The semiconductor device of claim 1, further comprising a third recess exposing a lower surface portion of the first semiconductor layer.

8. The semiconductor device of claim 7, wherein the third recess has sidewalls that are substantially perpendicular to the first semiconductor layer.

9. The semiconductor device of claim 1, wherein the cavity has a rounded off edge formed by a portion of the capping layer.

10. The semiconductor device of claim 9, wherein the rounded off edge of the cavity is adjacent to the rounded off surface of the second semiconductor layer.

11. The semiconductor device of claim 1, wherein the first semiconductor layer has a portion permanently attached to the semiconductor substrate.

12. The semiconductor device of claim 5, wherein the first contact layer is formed on sidewalls of the first recess and extending to an upper surface of the capping layer.

13. The semiconductor device of claim 1, wherein the capping layer is in direct contact with the substrate.

* * * * *